United States Patent [19]
Shibayama et al.

[11] 4,442,199
[45] Apr. 10, 1984

[54] PATTERN FORMATION WITH NEGATIVE TYPE RESIST

[75] Inventors: Kimio Shibayama, Sendai; Kingo Itaya, Tagajyo; Teruo Fujimoto, Nagaoka, all of Japan

[73] Assignee: Toyo Soda Manufacturing Co., Ltd., Shin-nanyo, Japan

[21] Appl. No.: 520,761

[22] Filed: Aug. 8, 1983

Related U.S. Application Data

[63] Continuation of Ser. No. 289,282, Aug. 3, 1981, abandoned.

[30] Foreign Application Priority Data

May 16, 1981 [JP] Japan ................... 56-72896

[51] Int. Cl.$^3$ ................................................ G03C 5/00
[52] U.S. Cl. ................................. 430/323; 430/286; 430/287; 430/313; 204/159.22
[58] Field of Search ............... 430/286, 287, 313, 323; 204/159.22

[56] References Cited

U.S. PATENT DOCUMENTS

| 3,669,662 | 6/1972 | Agnehoiri | 430/286 |
| 3,808,155 | 4/1974 | Broyde | 430/286 |
| 3,894,163 | 7/1975 | Broyde | 430/286 |
| 4,208,211 | 6/1980 | Bowden | 430/314 |

Primary Examiner—Jack P. Brammer
Attorney, Agent, or Firm—Oblon, Fisher, Spivak, McClelland & Maier

[57] ABSTRACT

A pattern formation with a negative type resist comprises forming a thin film made of a resist on a board and irradiating light or radiation; developing and etching the product. The resist is a diene polymer obtained by a living polymerization in the presence of an organometallic compound or a cyclic polymer thereof.

2 Claims, 2 Drawing Figures

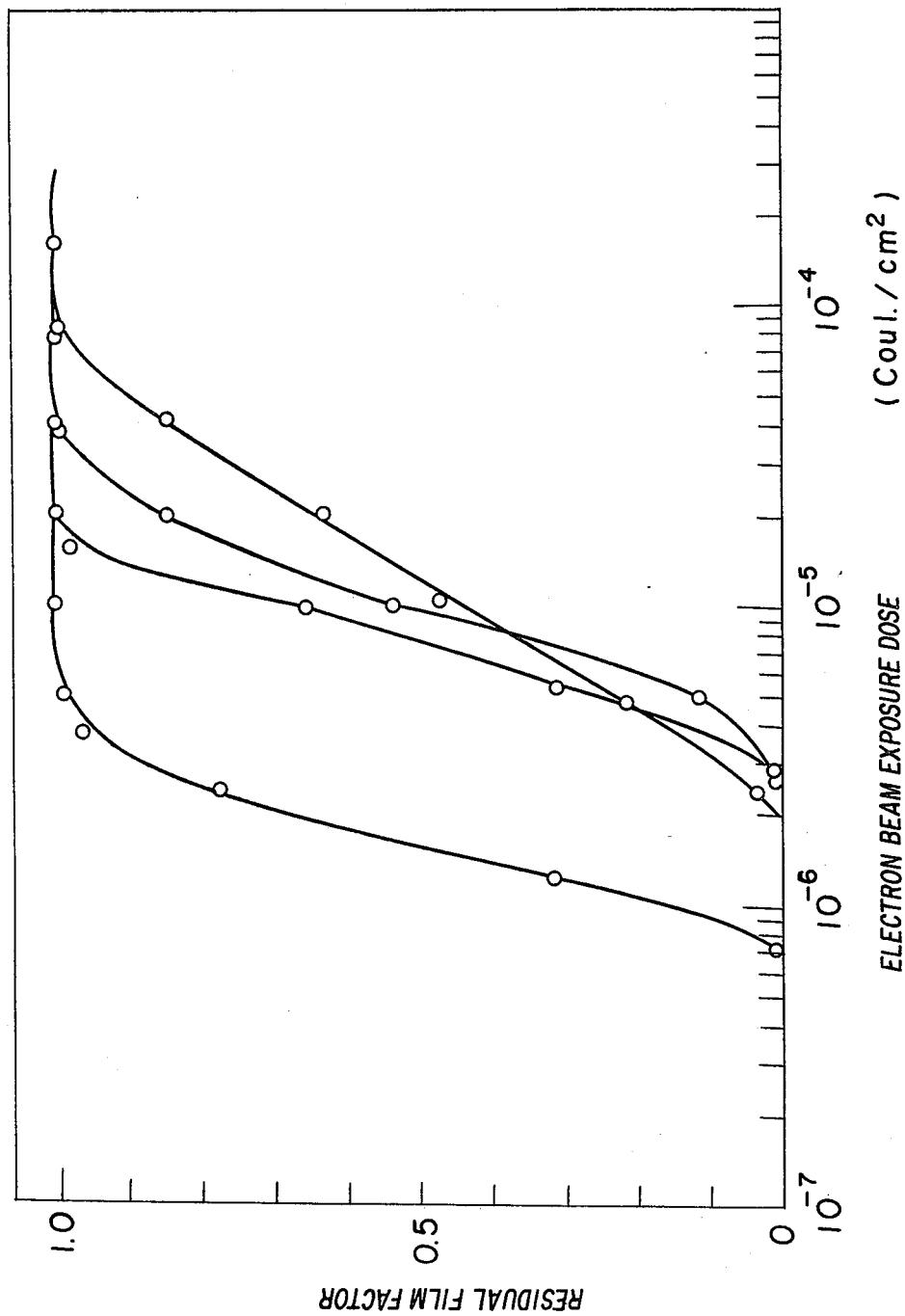
F I G. 1

(a)

(b)

(c)

PATTERN FORMATION WITH NEGATIVE TYPE RESIST

This application is a continuation of application Ser. No. 289,282, filed Aug. 3, 1981, now abandoned.

BACKGROUND OF THE INVENTION

1. Field of the Invention

The present invention relates to a pattern formation with a light and radiation sensitive a negative type resist which is utilized for a preparation of semiconductors, super conductive Josephson devices, elastic surface wave devices etc.

2. Description of the Prior Art

As the etching step in the production of semiconductor integrated circuits, a process for forming an etched pattern by using a light sensitive resin which is sensitive to visible ray and ultraviolet ray (photoresist) has been practically employed.

The photoresists are classified into positive and negative photoresists. The positive photoresists are decomposed in polymer chain by light to be soluble in a solvent and can be a mixture of a phenol type polymer and a diazoquinone derivative. On the other hand, the negative photoresists are crosslinked in molecular chains by light to be insolubilized to a solvent and can be a mixture of a cinnamic acid derivative, a bisazido derivative and a rubber type resist material such as natural rubber, polyisoprene and polybutadiene in a cyclic form. Recently, requirements of higher density and higher integration of devices have been increased to improve reliability and characteristics of the integrated circuits. Thus, special studies for development of ultrafine work technology for circuit patterns have been made. In the studies, a process for forming a circuit pattern having high accuracy by exposure of high energy radiation such as far ultraviolet rays having short wavelength, X ray and electron bean instead of visible light has been developed. The process has been practically employed for a preparation of a circuit pattern mask. The process for producing a high density integrated circuit comprises a step of producing a mask by a radiation drawing process and a step of printing a circuit pattern of the mask on a silicon substrate. In the step of production of the mask, a radiation sensitive polymer is used as a resist. In the printing step, the conventional photoresist has been used. In both steps, a resist material is coated on a substrate to form a film and is exposed by the radiation or light and is developed to form a fine pattern and then, the layer having the fine pattern on the board is etched to remain the pattern forming part. In the step of the production of the integrated circuit, high sensitivity and high resolution are important as functional characteristics required for the resist. A resist corresponding to fine work accuracy upto 1 $\mu$m as the resolution is especially required, in view of severer requirement for higher density of an integrated circuit.

In the etching step, a dry etching process by a gas plasma or a reaction sputtering has been newly employed instead of a wet etching process. Thus, excellent resist durable to the dry etching is required. Certain radiation sensitive resist used for the production of the mask have been proposed. It is quite small to satisfy with all of the above-mentioned requirements. For example, epoxy 1,4-polybutadiene has been known as the negative type resist and it has high sensitivity in the order of $10^{-7}$ C/cm$^2$ but has unsatisfactory resolution. On the other hand, said rubber type negative type resist has been mainly utilized as a photoresist used in a printing process. Such resist has high sensitivity but has not satisfactory resolution. In a practical application, the accuracy for about 3 $\mu$m has been limit. It has been difficult for using it in a production of an integrated circuit having high integration which requires higher accuracy.

SUMMARY OF THE INVENTION

It is an object of the present invention to overcome the disadvantages of the conventional light and radiation sensitive resists especially rubber type resists which are mainly used in a fine work process for forming a circuit pattern.

The foregoing and other objects have been attained by providing a pattern formation with negative type resist which comprises forming a thin film made of a resist on a substrate and irradiating light or radiation; developing and etching the product wherein a diene polymer obtained by a living polymerization in the presence of an organometallic compound or a cyclic polymer thereof whereby a fine pattern formation accuracy in a production of an integrated circuit is remarkably improved by using a rubber negative type resist which has high sensitivity to light and radiation and excellent resolution and excellent dry etching resistance.

BRIEF DESCRIPTION OF THE DRAWINGS

FIG. 1 shows the relation of electron beam exposure dose and residual film factors. The curves 1, 2, 3 and 4 respectively show the relations of the isoprene polymer in Example 1, the isoprene polymer in Example 2, the butadiene polymer in Example 3; and rubber type resist in Reference 1.

DETAILED DESCRIPTION OF THE PREFERRED EMBODIMENTS

Figure 2:
FIG. 2 is an electron microscopic photograph of the fine pattern obtained by using the butadiene polymer of Example 3. (a), (b), and (c) of FIG. 2 respectively show each line/space of 1.0 $\mu$m, 0.5 $\mu$m and 0.31 $\mu$m.
Figure 2:
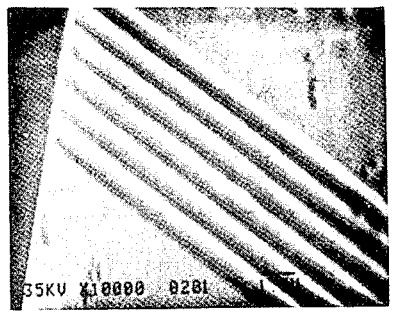
Figure 2:
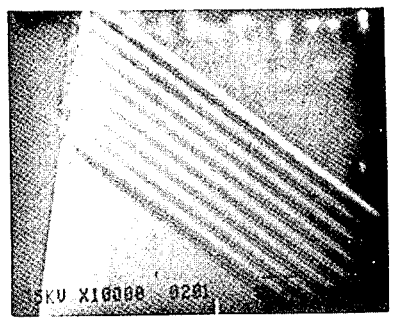

The conventional rubber type resists are made of natural rubber and sythetic rubbers. The molecular weight distributions of the resists are remarkably broad, to have the dispersion factor defined by $\overline{Mw}/\overline{Mn}$ of 2 or 3 or more wherein $\overline{Mw}$ represents a weight average molecular weight and $\overline{Mn}$ represents a number average molecular weight.

In the present invention, the molecule characteristics especially the molecular weight distribution of the rubber type resists have been considered to improve the resolution by using a diene polymer having a dispersion factor of about 1.

The diene polymer having a dispersion factor upto 1.1 which is substantially single dispersion factor can be obtained by a living polymerization of a diene monomer especially isoprene or butadiene in the presence of an organometallic compound such as butyl lithium as an initiator.

The organometallic compounds as the initiator for the living polymerization can be butyl lithium, sodium naphthalene, sodium anthracene, sodium biphenyl, phenyl isopropyl potassium, $\alpha$-methyl styrene tetramer potassium etc.

A selection of a solvent for the polymerization is remarkably important in view of the micro-structure of the resulting diene polymer. When isoprene is polymerized in the presence of butyl lithium as an initiator, 1,4-addition polymer is substantially selectively produced in a hydrocarbon solvent such as hexane, cyclohexane and benzene, however, 1,2-addition or 3,4-addition polymer is mainly produced in a polar solvent such as tetrahydrofuran, tetrahydropyran and dioxane.

The molecular weight of the diene polymer used in the present invention is not critical. It is preferable to consider a polymerization condition so as to give a molecular weight of at least 10,000 preferably at least 20,000 in view of molecular weight dependency of sensitivity of the resist comprising the polymer.

In the present invention, the resulting diene polymer is dissolved in a solvent such as toluene, xylene and chlorobenzene and the solution is coated by a spin coating process to form a thin resist film layer on a substrate and the layer is exposed by radiation such as electron beam. It is possible to modify the resulting polymer by an epoxidation to obtain epoxidized 1,4-polyisoprene or epoxidized 1,4-polybutadiene and to use the modified polymer for the radiation exposure.

In usual, the rubber type resist is a cyclic diene polymer. The diene polymer obtained in the present invention can be treated by dissolving the polymer in a solvent such as xylene and reacting it in the presence of anhydrous stannic chloride to obtain a cyclic product.

When the diene polymer or the cyclic diene polymer is used as the photoresist, a bisazido derivative such as 2,6-bis(4'-azidobenzal)-4-methylcyclohexanone is added as a photocrosslinking agent at a ratio of several % based on the polymer and they are dissolved in a solvent and the solution is coated and exposed by the same manner.

The examples of productions of resists and pattern formations with the resists will be illustrated.

EXAMPLE 1

A living polymerization of isoprene was carried out in the presence of n-butyl lithium. In a vacuum of $10^{-5}$ mmHg, 20 g. of isoprene which was completely dehydrated and 300 ml. of tetrahydrofuran were mixed and stirred and then, 10 ml. of a solution of n-butyl lithium in hexane (concentration of $1.2 \times 10^{-4}$ mol/ml) was added to the mixture to polymerize isoprene at $-20°$ C. for 16 hours. The reaction mixture was poured into ethanol to precipitate the polymer. The conversion was 100%. A micro structure of the resulting isoprene polymer was measured by NMR. As a result, ratios of 1,4-addition, 3,4-addition, and 1,2-addition were respectively 7%, 62% and 31%. A molecular weight of the polymer measured by a light-scattering photometer was $2.1 \times 10^4$. According to an evaluation of molecular weight distribution by a ultracentrifugation velocity method, a dispersion factor was 1.03 to confirm that the polymer had substantially a single dispersion factor.

The resulting isoprene polymer was used for a fine work as an electron beam resist. The polymer was dissolved in chlorobenzene at a concentration of 15 wt.%. The solution was filtered through a filter having a pore diameter of 0.2 μm and coated on a silicone substrate by a spin coating method to form a uniform layer having a thickness of about 0.5 μm. The product was heated at 80° C. for 30 minutes in nitrogen atmosphere and then, a pattern was drawn by an electron beam exposure device (acceleration voltage of 20 KV). After the electron beam exposure, it was developed in benzene-toluene mixed solvent (1:1 volumetric ratio) for 3 minutes and was rinsed with butyl acetate. A residual film factor (defined by residual film thickness normalized to initial film thickness) to an electron beam exposure dose (C/cm$^2$) was measured. The result was shown in FIG. 1. A sensitivity is defined by an exposure dose to 0.5 of the residual film factor. In FIG. 1, the sensitivity was $8 \times 10^{-6}$ C/cm$^2$. A resolution index γ calculated from the sensitivity curve by the conventional method was 1.5.

EXAMPLES 2 and 3

Each polymer was produced by polymerizing isoprene or butadiene in the presence of sec-butyl lithium as an initiator in hexane as a solvent at 35° C.

In accordance with the methods of Example 1, each micro structure, each molecular weight and each molecular weight distribution of each polymer were measured. The results are shown in Table 1.

In accordance with the method of Example 1, each sensitivity curve was obtained. The results are shown in FIG. 1. Each sensitivity and each γ value calculated from the curve are shown in Table 1.

Each resolution of each resist was tested by varying a line/space size as patterns drawn by an electron beam. The results of the resolution in the case of the butadiene polymer and shown in FIG. 2 by an electron microscopic photograph. A fine pattern having a line width of 0.31 μm and a space of 0.31 μm was resoluted. In the case of the isoprene polymer, the same pattern was resoluted.

It is clearly understood that such resist can be utilized for a fine work in a level of submicron upto 1 μm.

TABLE 1

| Example | 1 | 2 | 3 |
|---|---|---|---|
| Polymer | polyisoprene | polyisoprene | polybutadiene |
| Micro-structure (%): | | | |
| 1,4-addition | 7 | 94 | 87 |
| 3,4-addition | 62 | 6 | — |
| 1,2-addition | 31 | 0 | 13 |
| Molecular weight (X10$^4$) | 2.1 | 8.0 | 20.0 |
| Dispersion factor (Mw/Mn) | 1.03 | 1.02 | 1.01 |
| Sensitivity (C/cm$^2$) | $8 \times 10^{-6}$ | $9 \times 10^{-6}$ | $1.6 \times 10^{-6}$ |
| γ value | 1.5 | 1.5 | 1.9 |

REFERENCE 1

In accordance with the process of Examples 1–3, except using a rubber type resist made of synthetic polyisoprene, characteristics to electron beam were tested. It was difficult to attain the resolution of a line/space having 1.0 μm. A resolution index γ calculated by the sensitivity curve to the resist was 0.6 which was remarkably smaller than the γ value in the cases of the resists of Examples 1 to 3.

The resolution was remarkably low. The results show that the fineness of circuit patterns is remarkably improved by the pattern formation of the present invention.

EXAMPLE 4

The isoprene polymer obtained in Example 2 was dissolved in xylene and a cyclic reaction of the isoprene polymer was carried out by the conventional process using anhydrous stannic chloride to obtain a solution of cyclic polyisoprene. The solution was admixed with 2,6-bis(4'-azidobenzal)-4-methylcyclohexanone and the solution was coated on a silicon substrate to form a thin resist film layer having a thickness of 0.6 μm. A chromium mask having various patterns having different line/space sizes was closely brought into contact with the layer of the silicon substrate. This was exposed by a high pressure mercury lamp as a light source to print the mask patterns. The unexposed portions were dissolved by a xylene-toluene mixed solvent to develop it. As a result, the resolution of a line/space having 1.0 μm was attained.

EXAMPLE 5

Each dry etching resistance of each polymer obtained in Examples 1 to 3 was tested.

A dry etching resistance of the polymer was tested. A cylindrical plasma reactor (frequency 13.56 MHz and output of 200 W) was used to measure an etching velocity to carbon tetrafluoride reaction gas plasma (5 vol.% of oxygen). As references, etching velocities of polystyrene and polymethyl methacrylate were also measured in the same condition. Each etching depth of each polymer film was measured after 15 minutes. As a result, it was 500 Å in the case of the isoprene polymers of Examples 1 and 2 and it was 150 Å in the case of the butadiene polymer of Example 3; 500 Å in the case of polystyrene; and 4000 Å in the case of polymethyl methacrylate. The dry etching resistances of the diene polymers were the same or higher than that of polystyrene.

We claim:

1. A method of forming a pattern with a negative type resist comprising forming a thin film made of a resist on a substrate and exposing the resist film imagewise to radiation;

developing and etching the product, where said resist is a diene polymer having a dispersion factor of about 1 obtained by a living polymerization of a diene monomer selected from the group consisting of isoprene and butadiene in the presence of an organometallic compound selected from the group consisting of butyl lithium, sodium naphthalene, sodium anthrasene, sodium biphenyl, phenyl isopropyl potassium, α-methyl styrene tetramer potassium and mixtures thereof.

2. The method of claim 1, wherein said diene polymer is a cyclic polymer.

* * * * *